US006888861B2

(12) United States Patent
Taguchi et al.

(10) Patent No.: US 6,888,861 B2
(45) Date of Patent: May 3, 2005

(54) SEMICONDUCTOR LASER APPARATUS, INFORMATION RECORDING/REPRODUCTION APPARATUS AND IMAGE RECORDING APPARATUS

(75) Inventors: Toyoki Taguchi, Yokohama (JP); Tetsuya Nagahama, Kawasaki (JP); Masayuki Tazawa, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 403 days.

(21) Appl. No.: 10/038,678

(22) Filed: Jan. 8, 2002

(65) Prior Publication Data

US 2002/0057721 A1 May 16, 2002

Related U.S. Application Data

(62) Division of application No. 09/267,136, filed on Mar. 11, 1999, now Pat. No. 6,345,062.

(30) Foreign Application Priority Data

Mar. 11, 1998 (JP) .......................................... 10-059860

(51) Int. Cl.[7] .............................................. H01S 3/00
(52) U.S. Cl. .................................................. 372/38.1
(58) Field of Search ............................. 372/38.1–38.09

(56) References Cited

U.S. PATENT DOCUMENTS

| 5,097,473 A | * | 3/1992 | Taguchi | 372/29.011 |
| 5,579,329 A | | 11/1996 | Taguchi | 372/38.01 |
| 5,694,409 A | | 12/1997 | Taguchi | 372/29.011 |
| 6,011,768 A | | 1/2000 | Taguchi | 369/116 |

* cited by examiner

*Primary Examiner*—Quyen Leung
(74) *Attorney, Agent, or Firm*—Oblon, Spivak, McClelland, Maier & Neustadt, P.C.

(57) ABSTRACT

The semiconductor laser apparatus includes a semiconductor laser, a detection element for detecting the intensity of the output light from the semiconductor laser, an error detection circuit containing a gain controllable operation amplifying circuit and a gain-fixed type control amplifying circuit connected to a next stage to the gain controllable operation amplifying circuit, to which a semiconductor laser drive control signal is input and an output signal of the detection element is input as a negative feedback signal, for outputting an error signal corresponding to a difference between the two input signals, a high-frequency signal generating circuit for generating a high-frequency signal having a predetermined frequency, a high-frequency signal superimposing circuit for superimposing the high-frequency signal onto the output signal from the error detection circuit, and a laser drive circuit for supplying a drive current to the semiconductor laser on the basis of the output signal from the high-frequency signal superimposing circuit.

12 Claims, 8 Drawing Sheets

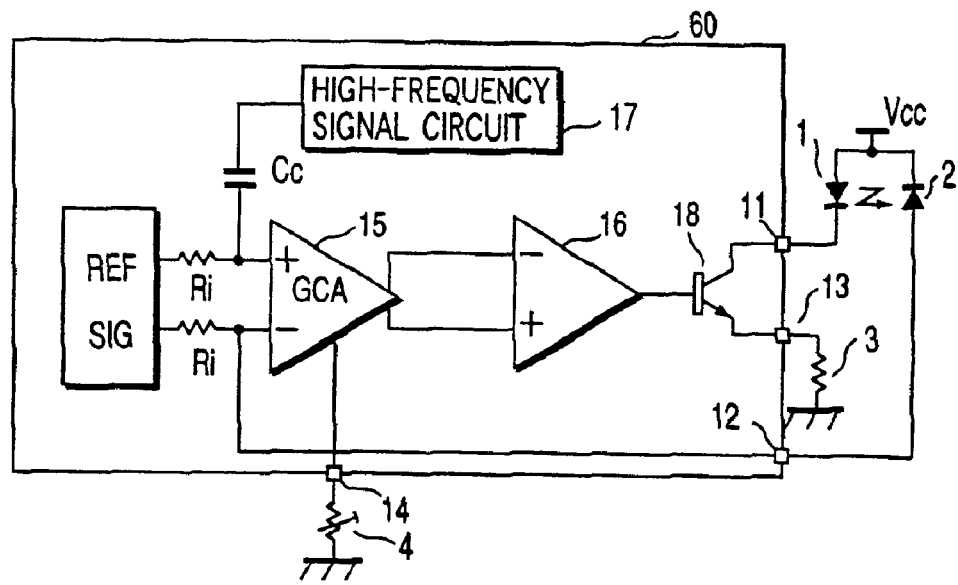
FIG. 1  PRIOR ART
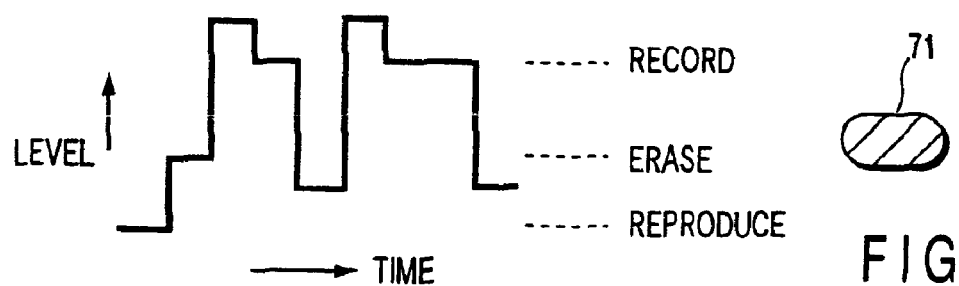
FIG. 2A
PRIOR ART
FIG. 2B
PRIOR ART

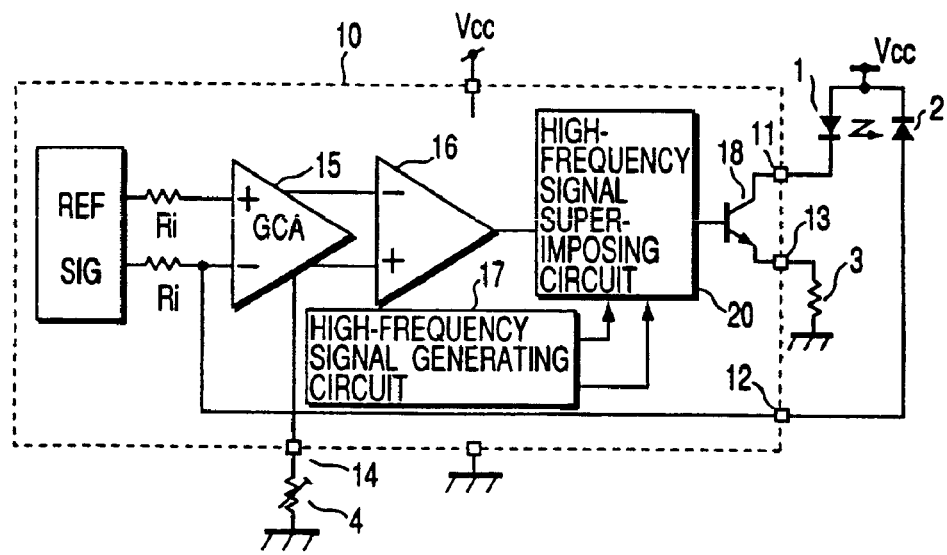
F I G. 4

SEMICONDUCTOR LASER APPARATUS, INFORMATION RECORDING/ REPRODUCTION APPARATUS AND IMAGE RECORDING APPARATUS

BACKGROUND OF THE INVENTION

The present invention relates to a semiconductor laser apparatus with an improved feedback control circuit for controlling the driving of the semiconductor laser, an information recording/reproduction apparatus such as an optical disk apparatus, and an image recording apparatus such as a laser beam printer or a copying machine.

Semiconductor lasers have advantages such as an easy direct light intensity modulation, small in size, a low consumption power and a high efficiency, and therefore they are widely used in memory devices having large capacities, such as optical disk devices and laser beam printers.

However, the semiconductor laser of the current type entails drawbacks, that is, the amount of light emitted is varied, and the laser itself is easily damaged due to excessive current, for various reasons.

When a semiconductor laser is driven, the amount of light emitted from the semiconductor laser is detected, and the driven amount is negative-feedback-controlled on the basis of the result thereof, and a control circuit for stabilizing the amount of light emitted is used. Further, in the case of the optical disk device, there are great demands of a light intensity modulation of a higher accuracy and lower noise during reproduction of data, in order to achieve a larger capacity and a higher speed of data transfer.

In particular, in a recordable medium or a phase changeable medium (PC medium) capable of overwriting data, the S/N ratio of the entire system greatly depends upon optical laser noise, and therefore it is very important to suppress such noise in order to increase the recording density.

Further, in a magneto-optical medium (MO medium), the differential detection method is used for the reproduction of a signal, and therefore the influence of laser noise is less as compared to the case of the recordable medium or PC medium. However, since the reproduction signal level is extremely low, it is required that the optical laser noise should be suppressed to a certain level or less.

Under these circumstances, a wide-band type front automatic power control (APC) disclosed in, for example, "High-Precision Laser Control Method (II) in Optical Disk Apparatus", General Meeting in Spring 1991 of the Institute of Electronics, Information and Communications Engineering, C-372 by Taguchi and Hoshino, has been proposed as a means for suppress the laser noise while using a presently available semiconductor laser as a light source of the optical disk device.

In this method, when output light from the semiconductor is irradiated onto a recording medium, light actually irradiated onto an optical disk (that is, part of the front light of the semiconductor laser) is guided to a light detector, and with use of the detection signal, the output light of the semiconductor laser is controlled. Thus, the control band can be widened, and the optical laser noise can be suppressed.

In the wide band front APC method, it is significant how wide the control band can be made as compared to the reproduction signal band. The technique of widening the control band larger than the reproduction signal band is disclosed in, for example, Jpn. Pat. Appln. KOKAI Publication No. 4-208581, U.S. Pat. No. 5,097,473 entitled "Semiconductor Laser Apparatus" and filed by the same applicants as those of the present invention.

This semiconductor laser apparatus is equipped with an error detector for generating an error signal corresponding to a difference between an output signal from a light intensity detector for detecting the intensity of output light from the semiconductor laser, and a laser drive control signal from outside, so as to constitute a feedback control system for negative-feedback-controlling the driving current for the semiconductor laser on the basis of the error signal. Further, the semiconductor laser apparatus includes a phase compensation circuit for negative-feed back a compensation current for compensating a phase delay of the feedback control system, to an input side of the error detector.

Further, the applicant of the present invention proposed "Semiconductor Laser Apparatus, Information Recording/ Reproducing Apparatus and Image Recording Apparatus" capable of dispensing with the adjustment of the CR time constant for the phase compensation of a phase compensation loop separately from the front APC loop, and imparting the variable gain function to the phase compensation amplifier (Jpn. Pat. Appln. KOKAI Publication No. 8-83948, U.S. Pat. No. 5,579,329).

FIG. 1 shows the first prior art example of the semiconductor laser apparatus using a wide band front APC circuit, which is applied to an optical disk drive apparatus.

As shown in this figure, a semiconductor device for driving a laser, is denoted by reference numeral 60, and a semiconductor laser 1, a monitor light receiving element 2, a resistor element 3 and a variable resistor element 4 are provided outside the semiconductor device 50 to be connected thereto. In this example, the laser driving semiconductor device 60 has a plurality of external terminals. The semiconductor laser 1 is connected between the first external terminal 11 and the external power source, the monitor-use light receiving element 2 is connected between the second external terminal 12 and the external power, and the resistor element 3 is connected between the third external terminal 13 and the ground potential, and the variable resistor element 4 is connected between the fourth external terminal 14 and the ground potential.

The monitor-use light receiving element 2 is, for example, a pin photo-diode, having one end to which, for example, a power voltage Vcc is applied as a DC reverse voltage. The light receiving element 2 receives part of the light emission output from the semiconductor laser 1, and generates a current corresponding to the level of the received light. The light receiving element 2 and the semiconductor laser 1 are used in the optical recording/reproducing head portion of an optical disk drive apparatus.

Next, the interior of the semiconductor device 60 for driving the laser, will now be described.

A gain controllable operation amplifier circuit (gain control amplifier: GCA) 15 has a non-reversal input terminal (+), to which a reference voltage REF is input via an input resistance Ri.

To the reversal input terminal (−) of the circuit 15, a laser drive control signal SIG is input via an input resistance Ri. A negative feedback signal is input from the monitor-use light receiving element 2 to the circuit 15 via the second external terminal 12, and a gain control voltage is supplied from the variable resistor element 4 via the fourth external terminal 14, to the gain control terminal of the circuit.

A gain-fixed type control amplification circuit 16 is an operation amplification circuit having a non-reversal input terminal (+) and a reversal input terminal (−) to which output signals (differential signals) from the GCA 15 are input, and the signals are amplified.

The GCA 15 and the control amplifying circuit 16 connected to the next stage, constitute an error detection circuit for detecting an error between a laser drive control signal input and a negative feedback signal input from the monitor-use light receiving element.

A high-frequency signal generating circuit 17 is designed to generate a high frequency signal of a predetermined frequency, to be superimposed on a laser drive control signal SIG, so as to suppress laser noise caused by reflection light from the optical disk, returning to the semiconductor laser (that is, return light) during a play-back of the optical disk. The high-frequency signal is supplied to the non-reversal input terminal (+) of the GCA 15 via a coupling capacitor Cc.

A laser drive circuit 18 is designed to current-drive the semiconductor laser 1 on the basis of an output signal from the control amplifying circuit 16. The laser drive circuit 18 is made of, for example, an NPN transistor having a base connected to an output terminal of the control amplifying circuit 16, a collector connected to the first external terminal 11, and an emitter connected to the third external terminal 13.

In the feedback control system including the GCA 15, the control amplifying circuit 16, the laser drive circuit 18 and the laser optical system (that is, the semiconductor laser 1 and the monitor-se light receiving element 2), if it is necessary to correct the dispersion of the frequency bands of the GCA 15 and the control amplifying circuit 16, the resistance value of the variable resistor element 4 is adjusted to control the gain of the GCA 15. Thus, the loop gain of the feedback control system can be varied, and the loop band can be varied.

Further, the dispersion of the manner of the superimposition of the high frequency signal on the laser drive control signal SIG, can be corrected by adjusting the resistance value of the variable resistor element 4. It should be noted that the variable resistor element 4 is of a semi-fixed type, which is set in a fixed state after being adjusted by the maker which produces a product using the semiconductor laser apparatus, when it is shipped from the factory.

In the first prior art semiconductor laser apparatus, the feedback control system is constituted by the following structure, that is, the intensity of output light from the semiconductor laser 1 is detected by the monitor-use light receiving element 2, an error signal corresponding to the difference between the detected output signal and the laser drive control signal SIG is generated by the error detection circuit (the GCA 15 and the control amplifying circuit 16), and a drive current of the semiconductor laser 1 is negatively fed back on the basis of the error signal so that the voltage level of the reversal input terminal (−) of the GCA 15 becomes equal to the voltage level of the non-reversal input terminal (+).

FIG. 2A shows an example of the waveform of the laser drive control signal SIG.

The semiconductor laser is current-driven with multi-value control signal waveform, and thus an accurate light intensity modulation beam which is set proportional to the laser drive control signal, can be irradiated onto the optical disk. Consequently, it is possible to form an excellent record mark 11 on the optical disk as shown in FIG. 2B.

The frequency-to-gain characteristics of the GCA 15 and the control amplifying circuit 16 are expanded to about 200 to 300 MHz, and the frequency of the high-frequency signal is set at a high band region which is located slightly lower than the vicinity of the cutoff frequency.

However, if the gain of the GCA 15 is varied by adjusting the resistance value of the variable resistor element 4, for the purpose of correcting the dispersion of the characteristics of the laser optical elements, the level of the high-frequency signal superimposed onto the high band region of the laser drive control signal is varied, and therefore a sufficient laser noise suppression effect cannot be obtained.

FIG. 3 shows the second prior art semiconductor laser apparatus which uses a wide band front APC circuit, which is applied in, for example, a laser beam printer.

The second prior art example is similar to the first prior art example, except for the following points: (1) the high-frequency signal generating circuit 17, the GCA 15 and the variable resistor element 4 are omitted; (2) a level shift circuit 81 for shifting the level of the reference voltage is added, and an input resistor Ri is connected between the output node of the circuit and the non-reversal input terminal (+) of a control amplifying circuit 86; (3) a level shift circuit 82 for shifting the level of the laser drive control signal is added, and an input resistor Ri is connected between the output node of the circuit and the reversal input terminal (−) of the control amplifying circuit 86; and (4) a modulation circuit 83 in which a switch element 84 and a current source 85 are connected in series, intermittently controlled (modulated) by pulse signals, for controlling the switching of the irradiation of laser beam by the semiconductor laser 1 in the optical printing head portion, is added between the input node of the level shift circuit 82 and the ground potential node.

Each of the two level shift circuits 81 and 82 is made of emitter follower circuits each using an NPN transistor, which are connected in three steps.

In the second prior art semiconductor laser apparatus, as the switch element 84 is controlled intermittently and a laser drive control signal is input from the level shift circuit 82 to the reversal input terminal (−) of the control amplifying circuit 86.

However, in each of the level shift circuits 81 and 82, due to the dispersion of the voltage between the base and emitter of the transistor of the emitter follower circuits structured in three steps, the control accuracy is greatly deteriorated. Further, the base-emitter voltage varies along with time, and therefore the deterioration of the control accuracy is a very serious problem.

As described above, the conventional laser drive circuit entails the problem that if the gain of GCA is varied by adjusting the resistance value of the external variable resistor element, the level of the high-frequency signal superimposed onto the high band region of the laser drive control signal varies, and thus a sufficient laser noise suppression effect cannot be obtained.

Apart from the above, due to the dispersion of the voltage between the base and emitter of the transistor of each emitter follower circuit used in each level shift circuit for shifting the levels of the reference voltage and the laser drive control signal in the pre-stage of the error detection circuit, the control accuracy of the laser drive is significantly deteriorated.

BRIEF SUMMARY OF THE INVENTION

The present invention has been proposed so as to solve the problems of the above-described conventional techniques, and an object thereof is to provide a semiconductor laser apparatus with a sufficient laser noise suppression effect, in which the level of the high-frequency signal superimposed onto the high band region of the laser drive control signal is not varied, even if the gain of the GCA in the feedback control system of the wide band front APC circuit is varied.

Another object of the present invention is to provide a semiconductor laser apparatus capable of suppressing the deterioration of the control accuracy of the laser drive, which is caused by the variation of the characteristics of the level shift circuit set in the pre-stage of the error detection circuit in the feedback control system of the wide band front APC circuit.

Still another object of the present invention is to provide an information recording/reproducing apparatus using a semiconductor laser apparatus such as above, with excellent recording/reproduction characteristics.

Still another object of the present invention is to provide an image recording apparatus using a semiconductor laser apparatus, capable of obtaining a high-frequency efficiency.

In order to achieve the above-described object, there is provided, according to the first aspect of the present invention, a semiconductor laser apparatus comprising: a semiconductor laser; a light intensity detection element for detecting the intensity of output light from the semiconductor laser; a gain variable type error detection circuit having an input terminal to which a control signal for drive-controlling the semiconductor laser is input, and a negative feedback input terminal to which an output signal from the light intensity detection element is input, for outputting an error signal corresponding to a difference between the two input signals; a high-frequency signal generating circuit for generating a high-frequency signal having a predetermined frequency; a high-frequency signal superimposing circuit for superimposing the high-frequency signal onto the output signal from the error detection circuit; and a laser drive circuit for supplying a drive current to the semiconductor laser on the basis of the output signal from the high-frequency signal superimposing circuit.

According to the second aspect of the present invention, there is provided an information recording/reproducing apparatus comprising:

a semiconductor laser apparatus including: a semiconductor laser; a light intensity detection element for detecting the intensity of output light from the semiconductor laser; a gain variable type error detection circuit having an input terminal to which a control signal for drive-controlling the semiconductor laser is input, and a negative feedback input terminal to which an output signal from the light intensity detection element is input, for outputting an error signal corresponding to a difference between the two input signals; a high-frequency signal generating circuit for generating a high-frequency signal having a predetermined frequency; a high-frequency signal superimposing circuit for superimposing the high-frequency signal onto the output signal from the error detection circuit; and a laser drive circuit for supplying a drive current to the semiconductor laser on the basis of the output signal from the high-frequency signal superimposing circuit;

an optical system for irradiating output light from the semiconductor laser apparatus onto a recording medium;

a detection section for detecting reflection light from the recording medium;

a reproduction signal generating section for generating a reproduction signal based on an output from the detection section; and a control signal generating section for generating the control signal to be supplied to the semiconductor laser apparatus.

According to the third aspect of the present invention, there is provided a semiconductor laser apparatus comprising: a semiconductor laser; a light intensity detection element for detecting the intensity of output light from the semiconductor laser; an amplifying circuit having a non-reversal input terminal and a reversal input terminal to which predetermined signals are respectively input, and to the reversal input terminal, an output signal from the light intensity detection element is input as a negative feedback signal; a laser drive circuit for supplying a drive current to the semiconductor laser on the basis of the output signal from the amplifying circuit; and a modulation signal current generating section for outputting a modulation signal current for adjusting an amount of output light of the semiconductor laser to the reversal input terminal of the amplifying circuit.

According to the fourth aspect of the present invention, there is provided an information recording/reproducing apparatus comprising:

a semiconductor laser apparatus including: a semiconductor laser; a light intensity detection element for detecting the intensity of output light from the semiconductor laser; an amplifying circuit having a non-reversal input terminal and a reversal input terminal to which predetermined signals are respectively input, and to the reversal input terminal, an output signal from the light intensity detection element is input as a negative feedback signal; a laser drive circuit for supplying a drive current to the semiconductor laser on the basis of the output signal from the amplifying circuit; and a modulation signal current generating section for supplying a modulation signal current for adjusting an amount of output light of the semiconductor laser to the reversal input terminal of the amplifying circuit;

an optical system for irradiating output light from the semiconductor laser apparatus onto a recording medium;

a detection section for detecting reflection light from the recording medium;

a reproduction signal generating section for generating a reproduction signal based on an output from the detection section; and a control signal generating section for generating the control signal to be supplied to the semiconductor laser apparatus.

According to the fifth aspect of the present invention, there is provided an image recording apparatus comprising:
a
a semiconductor laser apparatus including: a semiconductor laser; a light intensity detection element for detecting the intensity of output light from the semiconductor laser; an amplifying circuit having a non-reversal input terminal and a reversal input terminal to which predetermined signals are respectively input, and to the reversal input terminal, an output signal from the light intensity detection element is input as a negative feedback signal; a laser drive circuit for supplying a drive current to the semiconductor laser on the basis of the output signal from the amplifying circuit; and a modulation signal current generating section for supplying a modulation signal current for adjusting an amount of output light of the semiconductor laser to the reversal input terminal of the amplifying circuit;

a scanning section for scanning output light from the semiconductor laser apparatus;

an image formation section for forming an image based on the scanning of the output light by the scanning section; and a control signal generating section for generating a control signal to be supplied to the semiconductor laser apparatus.

In the semiconductor laser apparatus and the information recording/reproducing apparatus having the above-described structures, even if the gain of the GCA in the feedback control system of the wide band front APC circuit is varied, the level of the high-frequency signal superimposed onto the high band region of the laser drive control signal is not varied, thus achieving a sufficient laser noise suppression effect.

Further, in the other semiconductor laser apparatus and the other information recording/reproducing apparatus using this semiconductor laser apparatus, and the image recording apparatus, which has the above-described structures, the deterioration of the control accuracy of the laser drive, which is caused by the variation of the characteristics of the level shift circuit located in the pre-stage in the control amplifying circuit used for the error detection, in the feedback control system of the wide band front APC circuit, can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing the first prior art example of the semiconductor laser apparatus using a wide band front APC, which is applied in an optical disk drive apparatus;

FIG. 2A shows an example of the waveform of a laser drive control signal in FIG. 1;

FIG. 2B is a diagram showing an example of the shape of a record mark formed on an optical disk to correspond to the waveform of the laser drive control signal shown in FIG. 1;

FIG. 4 is a circuit diagram showing the semiconductor laser apparatus using a wide band front APC according to the first embodiment of the present invention, which is applied in an optical disk drive apparatus;

DETAILED DESCRIPTION OF THE INVENTION

Figure 3:
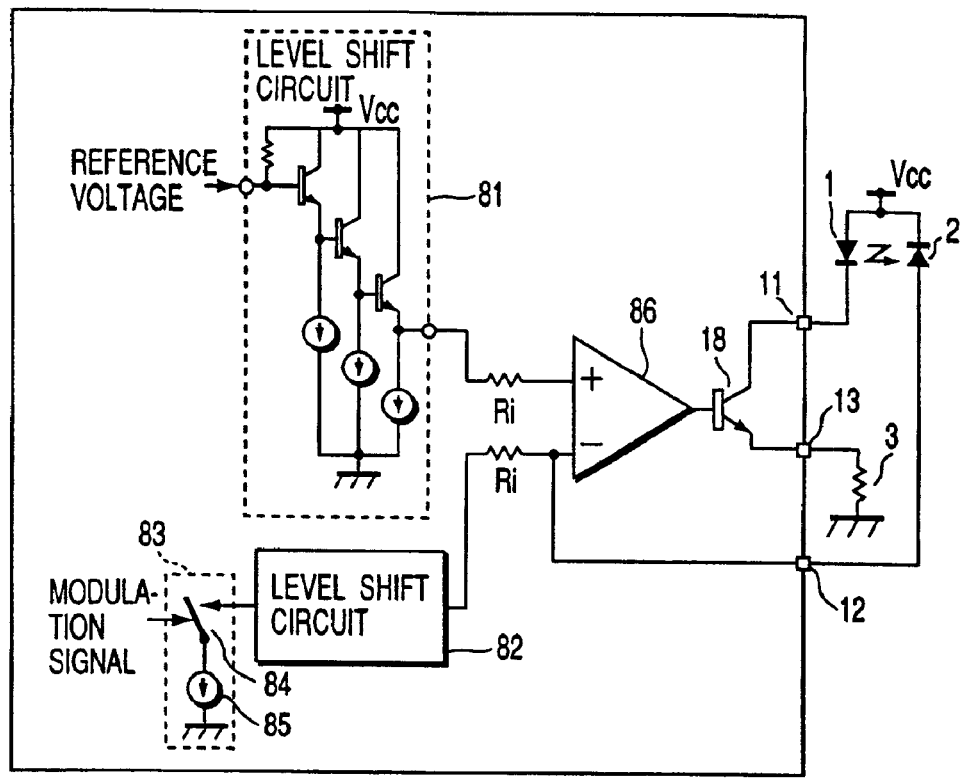
FIG. 3 is a circuit diagram showing the second prior art example of the semiconductor laser apparatus using a wide band front APC, which is applied in a laser beam printer.

Embodiment of the present invention will now be described in detail with reference to accompanying drawings.

FIG. 4 shows an example in which the semiconductor laser apparatus using a wide band region front APC circuit, according to the first embodiment of the present invention, is applied to an optical disk drive apparatus.

The structure of this semiconductor laser apparatus is similar to that of the prior art semiconductor laser apparatus shown in FIG. 1 except for the following points. That is, a high-frequency signal superimposing circuit 20 is added between the control amplifying circuit 16 and the laser drive circuit 18, and the destination where the high-frequency signal outputted from the high-frequency signal generating circuit is supplied, is changed to the high-frequency signal superimposing circuit 20 by changing the connection.

In FIG. 4, a semiconductor device for driving a laser, is denoted by reference numeral 10, and a semiconductor laser 1, a monitor-use light receiving element 2, a resistor element 3 and a variable resistor element 4 are provided outside the semiconductor device 10 to be connected thereto. In this example, the laser driving semiconductor device 10 has a plurality of external terminals. The semiconductor laser 1 is connected between the first external terminal 11 and the external power source, and the monitor-use light receiving element 2 is connected between the second external terminal 12 and the external power. Further, the resistor element 3 is connected between the third external terminal 13 and the ground potential, and the variable resistor element 4 is connected between the fourth external terminal 14 and the ground potential.

The monitor-use light receiving element 2 is, for example, a pin photo-diode, having one end to which, for example, a power voltage Vcc is applied as a DC reverse bias voltage. The light receiving element 2 receives part of the light emission output from the semiconductor laser 1, and generates a current corresponding to the level of the received light. The light receiving element 2 and the semiconductor laser 1 are used in the optical recording/reproducing head portion of an optical disk drive apparatus.

Next, the interior of the semiconductor device 10 for driving the laser, will now be described.

A GCA 15 is formed by a bipolar transistor having a non-reversal input terminal (+), to which a reference voltage REF is input via an input resistance Ri, and a reversal input terminal (−) to which a laser drive control signal SIG is input via an input resistance Ri.

A detection signal is input from the monitor-use light receiving element 2 to the reversal input terminal (−) via the second external terminal 12, and a gain control current is supplied from the variable resistor element 4 of the GCA 15 via the fourth external terminal 14, to the gain control terminal of the circuit.

A control amplification circuit 16 is formed of a bipolar transistor having a non-reversal input terminal (+) and a reversal input terminal (−) to which output signals (differential signals) from the GCA 15 are input, and is an operation amplifying circuit designed to amplify these signals.

A high-frequency signal generating circuit 17 is designed to generate a high frequency signal of a predetermined frequency, to be superimposed on a laser drive control signal SIG, so as to suppress laser noise caused by reflection light from the optical disk, returning to the semiconductor laser (that is, return light) during a play-back of the optical disk. The high-frequency signal generating circuits outputs a high-frequency signal as, for example, a differential signal.

A high-frequency signal superimposing circuit 20 is designed to superimpose a high-frequency signal supplied from the high-frequency signal generating circuit 17, onto an output signal (laser drive control signal) of the control amplifying circuit 16, to be outputted.

A laser drive circuit 18 is designed to current-drive the semiconductor laser 1 on the basis of an output signal from the high frequency signal superimposing circuit 20. the laser drive circuit 18 is made of, for example, an NPN transistor having a base connected to an output terminal of the high-frequency signal superimposing circuit 20, a collector connected to the first external terminal 11, and an emitter connected to the third external terminal 13.

Figure 5:
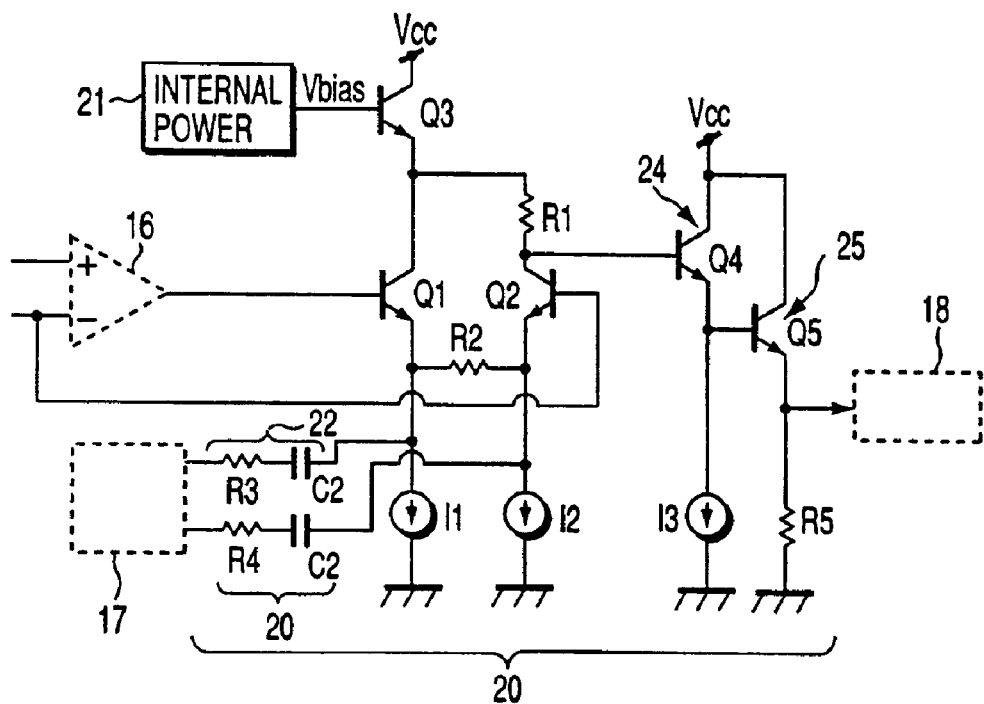
FIG. 5 is a circuit diagram showing a specific example of the high-frequency signal superimposing circuit 10 shown in FIG. 4.

FIG. 5 shows a specific example of the high-frequency signal superimposing circuit shown in FIG. 4.

In the high-frequency signal superimposing circuit, a base of a first NPN transistor Q1 is connected to the output terminal of the control amplifying circuit 16, and a base of a second NPN transistor Q2 is connected to the reversal input terminal of the control amplifying circuit 16.

A first constant current source I1 is connected between an emitter of the first NPN transistor Q1 and the ground node, and a second constant current source I2 is connected between an emitter of the second NPN transistor Q1 and the ground node.

Further, a collector-emitter of a third NPN transistor Q3 is connected between a power node to which a power voltage of, for example, 5V (Vcc) is supplied, and a collector of the first NPN transistor Q1, and a DC bias voltage Vbias generated by an internal power 21 is applied to a base of the third NPN transistor Q3.

Furthermore, a first resistor element R1 is connected between an emitter of the third NPN transistor Q3 and a collector of the second NPN transistor Q2, and a second resistor element R2 is connected between the emitter of the first NPN transistor Q1 and the emitter of the second NPN transistor Q2.

The first NPN transistor Q1, the second NPN transistor Q2, the first resistor element R1, the second resistor element R2, tile first constant current source I1 and the second constant current source I2 constitute a differential amplifying circuit.

The first resistor element R1 (the load resistor of the second NPN transistor Q2) and the second resistor element R2 serve to determine the gain of the differential amplifying circuit.

Then, the high-frequency signal outputted as a differential signal from the high-frequency signal generating circuit 17 is supplied to the emitter of the first NPN transistor Q1 via a first phase adjusting circuit 22 formed of the third resistor element R3 and the first coupling capacitor C1 connected in series.

Further, the high-frequency signal is supplied to the emitter of the second NPN transistor Q2 via a second phase adjusting circuit 23 formed of the fourth resistor element R4 and the second coupling capacitor C2 connected in series.

The output signal of the collector of the second NPN transistor Q2 is input to the input terminal of the laser drive circuit 18 via a first emitter follower 24 and a second emitter follower 25 in order.

The first emitter follower 24 has a structure in which a collector-emitter of the fourth NPN transistor Q4 and the third constant current source I3 are connected in series between the power node and the ground node, and the second emitter follower 25 has a structure in which a collector-emitter of the fifth NPN transistor Q5 and the fifth resistor element R5 are connected in series between the power node and the ground node.

In the feedback control system including the GCA 15, the control amplifying circuit 16, the high-frequency signal superimposing circuit 20, the laser drive circuit 18 and the laser optical system (the semiconductor laser 1 the monitor light receiving element 2), if it is necessary to correct the dispersion of the frequency bands of the GCA 15 and the control amplifying circuit 16, the resistance value of the variable resistor element 4 is adjusted so as to control the gain of the GCA 15, and therefor the loop gain of the feedback control system is varied. Thus, the loop band can be changed.

It should be noted that the variable resistance element 4 is of a semi-fixed type, which is set in a fixed state after being adjusted by the maker which produces a product using the semiconductor laser apparatus, when it is shipped from the factory.

In the semiconductor laser apparatus shown in FIG. 4, the intensity of the output light of the semiconductor laser 1 is detected by the monitor-use light receiving element 2. An error signal which corresponds to the difference between thus obtained detected output signal and the laser drive control signal is generated by an error detection circuit (the GCA 15 and the control amplifying circuit 16).

The feedback control system has the structure in which the drive current of the semiconductor laser 1 is negatively fed back so as to make the voltage level of the reversal input terminal (−) of the GCA 15 equal to the voltage level of the non-reversal input terminal (+), on the basis of the error signal.

In the high-frequency signal superimposing circuit 20, when the laser drive control signal is amplified by the first NPN transistor Q1 and the second NPN transistor Q2, the high-frequency signal supplied as a differential signal from the high-frequency signal generating circuit 17 via the first phase adjusting circuit 22 and the second phase adjusting circuit 23 is superimposed to the control signal.

The superimposed signal is buffer-amplified by the first emitter follower 24 and the second emitter follower 25, and then supplied to the laser drive circuit 18.

In this case, the high-frequency signal is supplied to the emitters of the NPN transistors Q1 and Q2 of the high-frequency signal superimposing circuit 20 provided in the next stage of the control amplifying circuit 16, independently from the laser drive control signal, and the high-frequency signal is superimposed (current-added) to the high band region of the laser drive control signal. However, if it is necessary to correct the dispersion of the frequency bands of the GCA 15 and the control amplifying circuit 16 in the feedback control system, the resistance value of the variable resistor element 4 is adjusted to control the gain of the GCA 15.

As described above, if the loop gain of the feedback control system is changed or the loop band is changed, the level of the superimposed high-frequency signal does not vary, but the signal to noise ratio (S/N) of the high frequency signal improves. Therefore, the laser noise suppressing effect is not deteriorated. Thus, an optical disk reproduction signal having a high S/N ratio can be obtained.

As described above, the level of the high-frequency signal does not vary, and therefore the cutoff frequency of the feedback control system can be expanded to, for example, 500 MHz, and the frequency of the high-frequency signal is increased higher than the conventional technique (for example, around 400 MHz). In this manner, the laser noise suppressing effect to the return light can be further improved.

Further, the structure of the semiconductor laser apparatus shown in FIG. 4, includes a wide band front APC circuit, and therefore the above-described effect of the wide band front APC method can be achieved.

A low-frequency component, for example, part of 100 MHz or lower, of the high-frequency signal supplied from the high-frequency signal generating circuit 17 to the high-frequency signal superimposing circuit 20 is blocked by the coupling capacitors C1 and C2 of the first phase adjusting circuit 22 and the second phase adjusting circuit 23. Consequently, the DC noise of the optical disk reproduction signal is reduced.

The emitter peaking characteristics of the NPN transistors Q1 and Q2 of the high-frequency signal superimposing circuit 20 are induced by the coupling capacitors C1 and C2. The characteristics cause the phase lead effect of a high-frequency signal region such as 100 MHz or higher, and as a result, a higher band region of the feedback control system can be achieved.

In order to suppress the influence of the output current variation, which depends upon the temperature dependency of the base-emitter voltage of each of the third NPN transistor Q3, the first emitter follower 24, the fourth NPN transistor Q4, the second emitter follower 25 and the fifth NPN transistor G5 in the high-frequency signal superimposing circuit 20, it is preferable that the bias voltage supplied to the internal power 21 should be made to have a temperature dependency.

Figure 6:
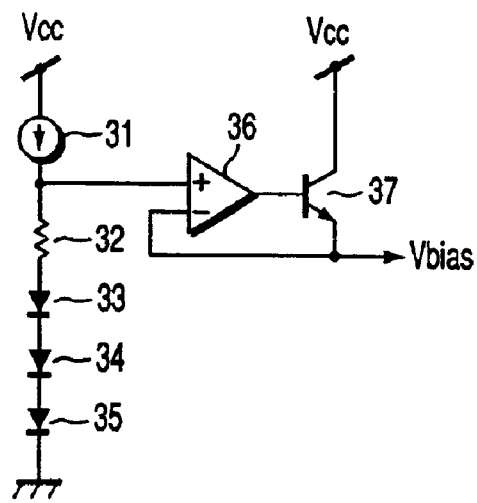
FIG. 6 is a circuit diagram showing a specific example of the internal power source shown in FIG. 5, which is made to have a preset temperature dependency.

FIG. 6 shows a specific example in which the internal power 21 shown in FIG. 4 is made to have a predetermined time dependency.

The internal power is designed to generate an internal power voltage which involves the voltage drop of the diode row in which diodes corresponding to the stage number +1 of the emitter followers 24 and 25 are connected in series.

In other words, the internal power consists of a constant current source 31, a resistor element 32 and three diodes 33 to 35, connected in series between the power node and the ground node, an operation amplifying circuit 36 having a non-reversal input terminal connected to the connection node between the constant current source 31 and the resistor element 32, and an NPN transistor 37 having a base connected to an output terminal of the operation amplifying circuit 36, a collector connected to the power node and an emitter connected to a reversal input terminal (−) of the operation amplifying circuit. An internal power voltage is output from the emitter of the NPN transistor 37.

The three diodes 33 to 35 have characteristics which correspond to the characteristics of the base-emitter voltages of the third NPN transistor Q3, the fourth NPN transistor Q4 and the fifth NPN transistor Q5, respectively. The collector-base of each NPN transistor is connected to the respect one of the diodes.

With use of an internal power voltage output from the internal power having the above-described structure, when the variation of the base-emitter voltage occurs due to the temperature variation, in each of the third, fourth and fifth NPN transistor Q3, Q4 and Q5, the internal power voltage varies accordingly due to the temperature variation, and therefore these temperature variations cancel with each other. Consequently, the influence of the output current variation, which depends upon the temperature variation, can be suppressed.

Figure 7:
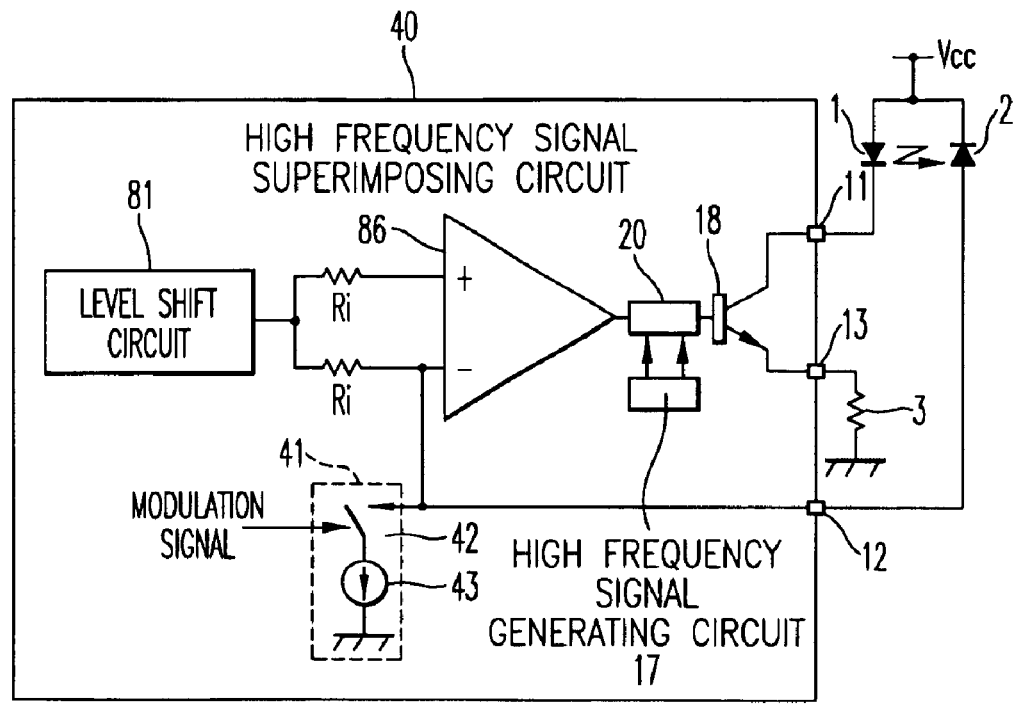
FIG. 7 is a circuit diagram showing the semiconductor laser apparatus using a wide band front APC according to the second embodiment of the present invention, which is applied in a laser beam printer.

FIG. 7 shows an example in which a semiconductor laser apparatus using a wide band front APC circuit, according to the second embodiment of the present invention, is used in a laser beam printer.

The structure of this semiconductor laser apparatus is similar to the conventional laser apparatus shown in FIG. 3, except for the following points: (1) the level shift circuit 82 for shifting the level of the reference voltage is omitted, and an input resistors Ri is connected between the output node of the level shift circuit to which a reference voltage is input, and the non-reversal input terminal (+) of the control amplifying circuit 86, and between the output node and the reversal input terminal (−); and (2) the modulation circuit 41 (made of the switch element 42 and the power source 43 connected in series), intermittently controlled (modulated) by pulse signals, for controlling the switching of the irradiation of laser beam is connected between the reversal input terminal (−) of the control amplifying circuit 86 and the ground node.

FIG. 7 illustrates a semiconductor device 40 for driving a laser, first to fourth external terminals 11 to 14, a semiconductor laser 1, a monitor light receiving element 2, a resistor element 3 and a variable resistor element 4.

The interior of the semiconductor device 40 for a laser drive includes a first level shift circuit 81, input resistors Ri, a modulation circuit 41 (modulation signal current generation section), a switch element 42, a constant current source 43, a control amplifying circuit 86 and a laser drive circuit 18.

As described in connection with the prior art example, the level shift circuit 81 is made of emitter follower circuits using NPN transistors connected in three steps. The resistance value of the input resistors Ri is set substantially equal to the equivalent feedback resistor of the feedback control system.

In the semiconductor laser apparatus shown in FIG. 7, the switch element 42 is intermittently controlled by a modulation pulse signal of the switch element 42, and thus a modulation signal current is given to the reversal input terminal (−) of the control amplifying circuit 86. Consequently, the output signal (laser drive control signal) of the control amplifying circuit 86 is intermittently modulated, and the irradiation of a laser beam by the semiconductor laser 1 is controlled by switch.

In this case, an output of the only one level shift circuit 18 is input to both the non-reversal input terminal (+) and the reversal input terminal (−) of the control amplifying circuit 86, and therefore the problem of the prior art technique, (the great deterioration of the control accuracy, or the like) which is caused by the dispersion of the characteristics of two level shift circuits 81 and 82, can be avoided.

Further, since the semiconductor laser apparatus shown in FIG. 7 has a wide band front APC circuit structure, the effect of the wide band front APC method, described above, can be obtained.

In the semiconductor laser apparatus shown in FIG. 7, it is possible as in the case of the apparatus shown in FIG. 4, that the GCA 85 is inserted in the pre-stage of the control amplifying circuit 86, and the variable resistor element 4 is connected to the control terminal thereof, so that outputs of the level shift circuit 81 are input to the non-reversal input terminal (+) and the reversal input terminal (−) of the GCA 85 via the input resistors Ri.

Figure 8:
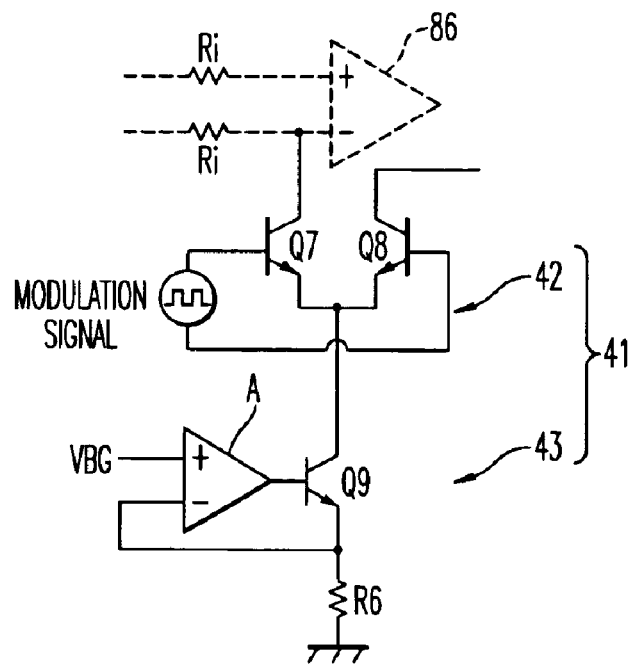
FIG. 8 is a circuit diagram showing a specific example of the modulation circuit (switch element and power source) shown in FIG. 7.

FIG. 8 shows a specific example of the modulation circuit 41 (switch element 42 and constant current source 43) shown in FIG. 7.

As shown in FIG. 8, the switch element 42 uses a differential circuit made of two NPN transistors Q7 and Q8 forming a differential pair. A collector of the NPN transistor Q7 is connected to the (−) input terminal of the control amplifying circuit 86, and a collector of the other NPN transistor Q8 is connected to a predetermined node.

An intermittent control modulation signal (pulse signal) is applied between the differential input terminals of the differential circuit, and the current power 43 is connected to the emitter-common connection node of the differential circuit.

The power source 43 is made of a voltage follower circuit in which a band gap voltage VBG, for example, is input to the (+) input terminal of the operation amplifying circuit A, a base of an NPN transistor Q9 is connected to the output terminal of the operation amplifying circuit A, a resistor element R6 is connected between an emitter of the NPN transistor Q9 and the ground node, and an emitter voltage of the NPN transistor Q9 is negatively fed back to the (−) input terminal of the operation amplifying circuit A. The collector of the NPN transistor Q9 is connected to the emitter common connection node of the differential circuit.

Figure 9:
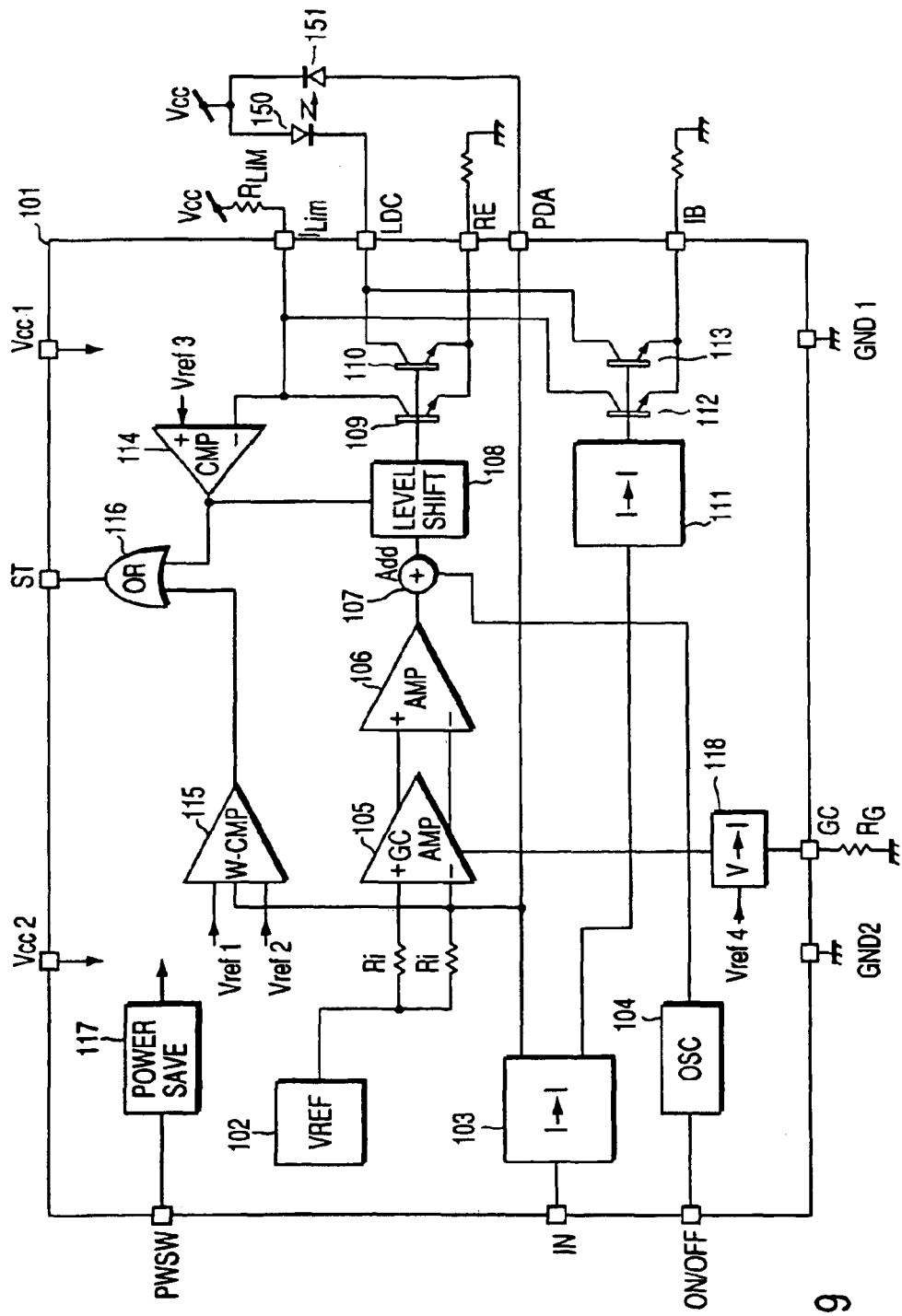
FIG. 9 is a circuit structure diagram showing the semiconductor laser apparatus according to the third embodiment of the present invention.

FIG. 9 is a block diagram showing a semiconductor laser apparatus according to the third embodiment of the present invention. The semiconductor laser apparatus includes a semiconductor laser control circuit 101 formed into an integrated circuit, a semiconductor laser 150 connected to the semiconductor laser control circuit 101 and a light detecting unit 151 for detecting output light from the semiconductor laser 150.

The semiconductor laser control circuit 101 has the following structure. A control current signal is input to an input terminal from outside, and converted into an internal control current signal by a first current-current conversion circuit 103. Then, the first current output is input to a gain-variable-type differential variable amplifier 105 having a gain control terminal connected to the GC terminal via the voltage-current conversion circuit 118, and wind comparator 115, whereas the second current output is input to the second current-current conversion circuit 111. In the differential variable amplifier 105, a reference voltage is biased via resistors Ri to the reversal amplifying input terminal and non-reversal input terminal of the differential variable amplifier 105. An output from the differential variable amplifier 105 is supplied to a control amplifying circuit 106 having predetermined frequency characteristics, and then a drive control signal is output.

The control signal is added to an output signal of a high-frequency signal generating circuit 104 by an adder circuit (high-frequency signal superimposition circuit) 107. The drive control signal output from an adder circuit 107 is set at a predetermined potential by a level shift 108, and then input to a transistor 109 for detecting a drive power of the semiconductor laser 150, and a transistor 110 for supplying a drive current to the semiconductor laser 150.

The size of the transistor 110 is about 50 times as large as that of the transistor 109. In the transistor 109, about 2% of the drive current flows, and the drive current is monitored by the voltage drop of an external resistor RLIM. The comparator 114 compares the voltage drop with a reference voltage Vref3, and outputs the detected result to the outside via an OR (logical add) circuit 116. Further, the comparator 114 limits the drive current by lowering the output potential of the level shift 108.

The window comparator 115 judges the state of the control as to whether or not the output potential of the PDA terminal voltage at the control feedback point is in a range between reference voltages Vref1 and Vref2, and the detected result is output via the OR circuit 116 to the outside.

In the meantime, the second current-current conversion circuit 111 outputs an internal current control voltage, which is input to the transistor 112 for detecting the drive current of the semiconductor laser 150 and the transistor 113 for supplying the drive current to the semiconductor laser 150.

The size of the transistor 112 is about 50 times as large as that of the transistor 113. In the transistor 109, about 2% of the drive current flows, and the drive current is monitored by the voltage drop of an external resistor RLIM. Further, the drive output current of the transistor 113 is supplied for addition to the semiconductor laser 150 via an LDC terminal.

Apart from the above, the semiconductor laser control circuit 101 is equipped with a power saving circuit 117 having a power monitoring function for automatically stopping the control operation upon detection of the lowering of the power voltage, and a function of switching the control operation between ON and OFF as it is controlled by the power monitoring function and an external means.

A control current signal from the first current-current conversion circuit 103 is a modulation signal current which has been intensity-modulated so as to indicate digital data, for example, and thus modulated current is input as a control current to the reversal input terminal of the differential variable amplifying section 105. The node of the light detector 151 is connected to a PDA terminal, and thus a monitor current of the light detector 151 is fed back to the reversal input terminal of the differential variable amplifier 105. In this manner, the output light from the semiconductor laser 150 is modulated in terms of light intensity in proportional to the modulation signal current which is a control current signal of the first current-current conversion circuit 103.

The bias voltage supplied to the reversal input terminal and non-reversal input terminal of the differential variable amplifier 105, is supplied commonly from the reference voltage source 102, and therefore the offset of the feedback system is greatly improved.

In the meantime, the drive current output of the transistor 113 controlled by the second current-current conversion circuit 111 is obtained by amplifying the modulation signal current, in which a feed forward control mode is co-used. By setting the drive current ratio between the drive current of the feedback control system and that of the feed forward control system to 1:1 or higher, the pulse characteristics are greatly improved. Further, when the signal delay amounts of the control amplifying circuit 106 and the second current-current conversion circuit 111 are substantially equalized, the load on the feedback control system is lightened, thus improving the pulse characteristics.

Figure 10:
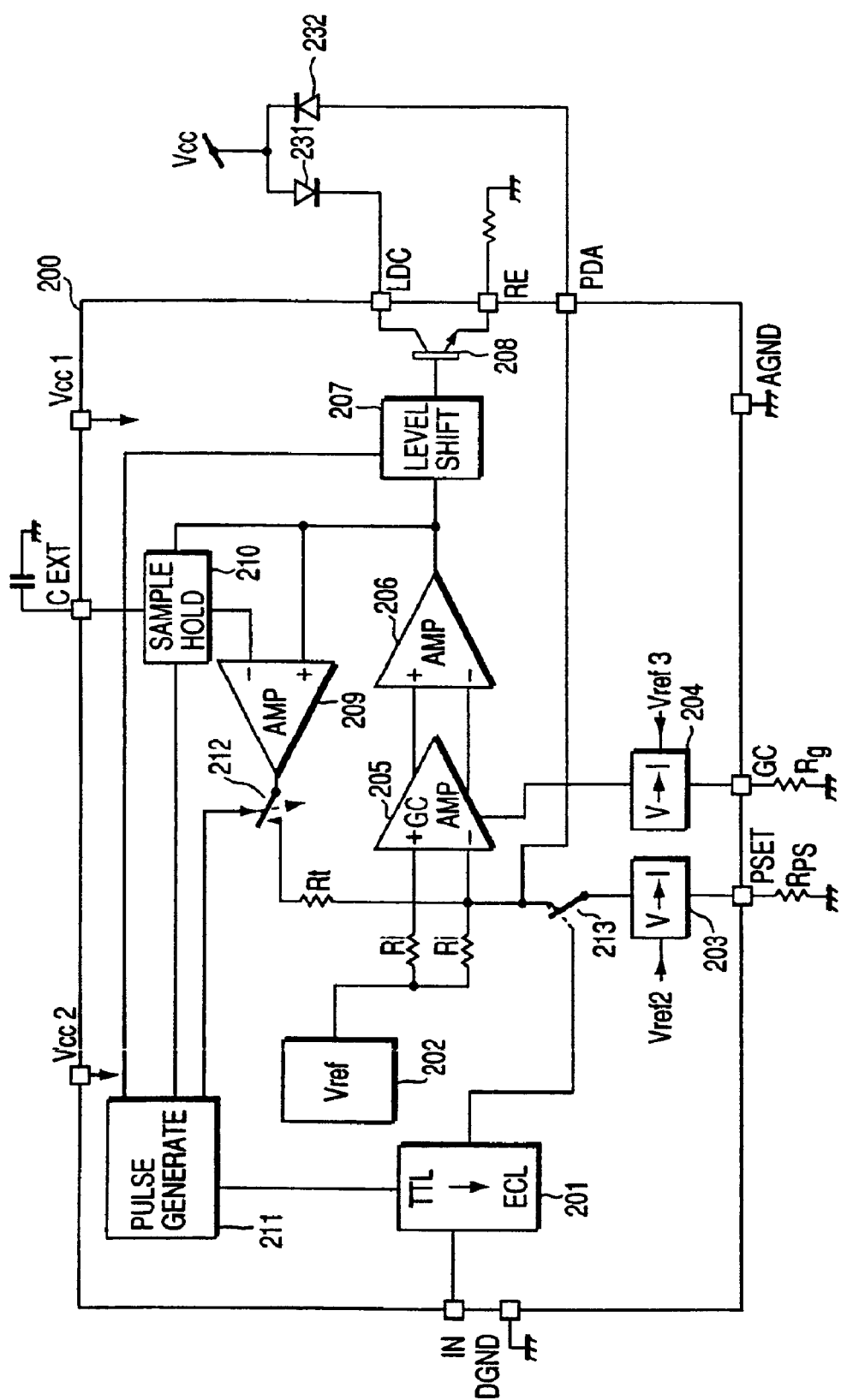
FIG. 10 is a circuit structure diagram showing the semiconductor laser apparatus according to the fourth embodiment of the present invention.

FIG. 10 is a block diagram showing a semiconductor laser apparatus according to the fourth embodiment.

The semiconductor laser apparatus includes a semiconductor laser control circuit 200 formed into an integrated circuit, a semiconductor laser unit 231 connected to the semiconductor laser control circuit 200 and a built-in light detector 232 for monitoring the output light.

The semiconductor laser control circuit 200 has the following structure. That is, a digital signal at a TTL level is input to the input terminal IN from outside, and a control SW signal is generated by a converter 201, which is supplied to a control current switch 213.

The first voltage-current conversion circuit 203 supplies a current set on the basis of the supplied reference voltage Vref2 and a resistor Rps connected to an output light amount setting PSET terminal, to the control current switch 213. The control current signal from the control current switch 21 is a modulation signal current which has been intensity-modulated so as to indicate digital data, for example, and thus modulated current is input as a control current to the reversal input terminal of the differential variable amplifying section 205. In the differential variable amplifier 205, a reference voltage is biased via resistors Ri to the reversal amplifying input terminal and non-reversal input terminal of the differential variable amplifier 205. An output from the differential variable amplifier 205 is supplied to a control amplifying circuit 206 having predetermined frequency characteristics, and then a drive control signal is output. The drive control signal is set at a predetermined potential by a level shift 207, and then input to a transistor 208 for supplying a drive current to the semiconductor laser 231. An output current of a second voltage-current converter 204 can vary the gain of the differential variable amplifier 205, thus making it possible to suppress the variation of the loop gain, caused by the dispersion of the monitor amount of the built-in light detector 232.

The anode of the light detector 232 is connected to a PDA terminal, and via the PDA terminal 225, a monitor current of the light detector 232 is negatively fed back to the reversal input terminal of the differential variable amplifying section 205. In this manner, the output light from the semiconductor laser 231 is modulated in terms of light intensity in proportional to the modulation signal current which is a control current signal of the control current switch 213. When an input of the converter 201 is at an H level, that is, the light emitting state, the semiconductor laser apparatus of this embodiment functions as in the case of the above-described embodiment shown in FIG. 9.

When an input of the converter 201 is at an L level, an output of the control amplifier 206 is input to an off-loop amplifier 209 and a sample-hold circuit 210. The off-loop amplifier 209 closes an off-loop switch 212 when the input is at the L level, and while the input is at the L level, it is fed back via an internal feedback resistor Rf, thus clamping the output of the control amplifier 206. A pulse generating circuit 211 serves to control the timing for the above-described operation. In particular, the pulse generating circuit 211 controls an output of the level shift 207, so as to set a base terminal voltage of a drive transistor 208 at zero, and while the input is at the L level, the drive current of the semiconductor laser is set to zero.

Figure 11:
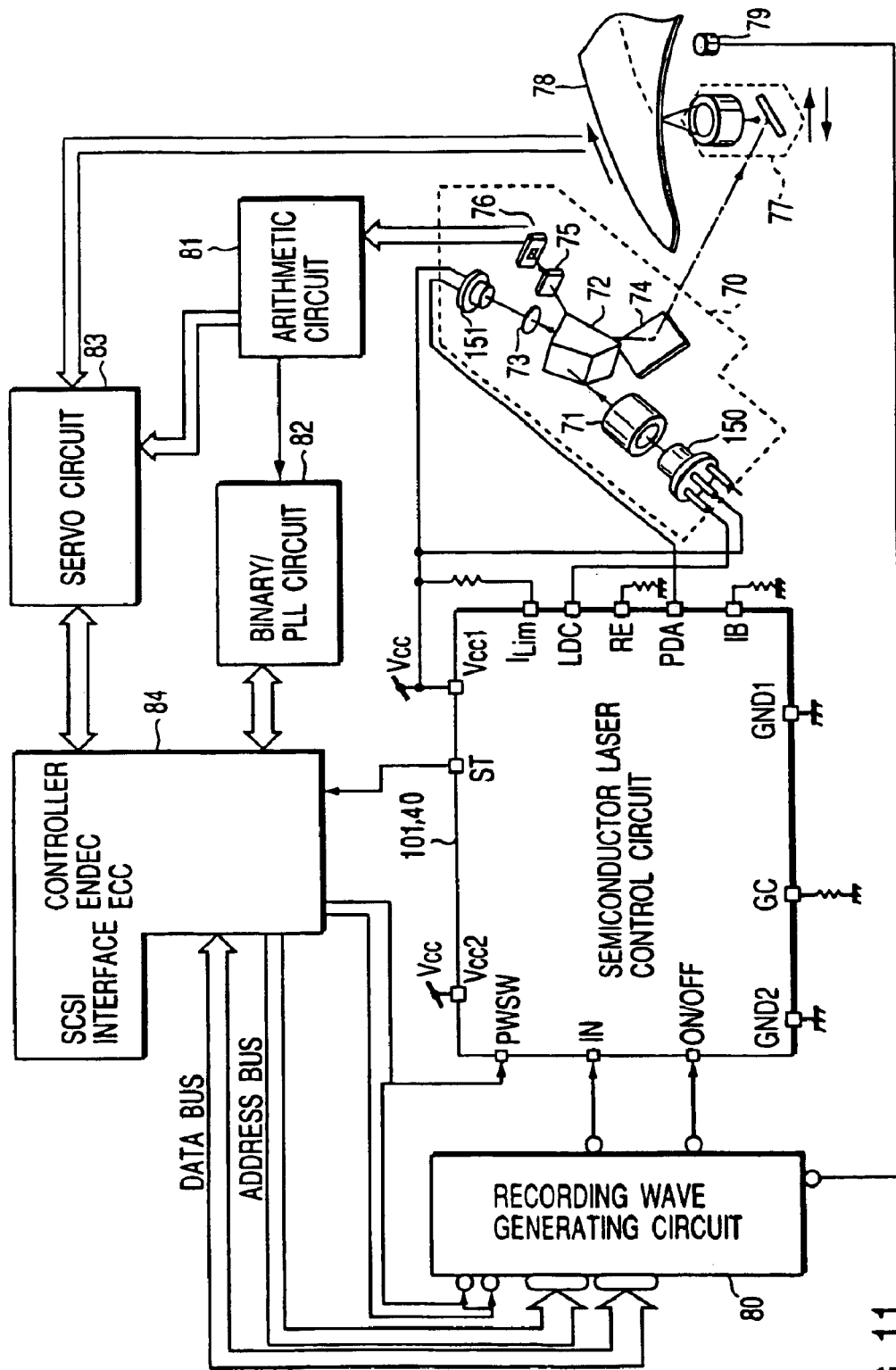
FIG. 11 is a diagram showing the structure of the information recording/reproducing apparatus constituted by the semiconductor laser apparatus shown in FIG. 9.

FIG. 11 is a block diagram showing the structure of an information recording/reproducing apparatus according an embodiment of the present invention, which uses the semiconductor laser apparatus discussed in the above-described embodiments.

The semiconductor laser control circuit 101 shown in FIG. 11, which includes the control amplifying circuit 106 and the high-frequency signal generating circuit 104, is controlled by a recording waveform generating circuit 80 for generating a control signal which controls a control current Ic and a high-frequency superimposition in terms of ON/OFF. A semiconductor laser 150 and a monitor-use light detector 151 are provided in a fixed optical unit 70.

When data is written onto an optical disk 78, the semiconductor laser 150 emits a laser beam in accordance with the control current Ic modulated in an analog or digital manner, depending upon the data. The output beam from the semiconductor laser 150 is guided to a moving optical head 77 by means of an optical unit 70 comprising a collimator lens 71, a composed prism 72, a converging lens 73, a galvano mirror 74, a reproduction hologram element 75 and the like. The moving optical head 77 is designed to be movable linearly in the radial direction of an optical disk 78 set and rotated in the information recording/reproducing apparatus.

In order to reproduce data recorded on the optical disk 78, a laser beam having a light intensity weaker than that of the time of recording, is output from the semiconductor laser 150 as a read-out beam. In this case, similarly, the read-out beam is guided to the optical disk 78 by the optical unit 70 and the moving optical head 77. At this time, reflection light from the optical disk 78 returns from the moving optical head 77 to the optical unit 70, and then the reflection light is splitted by the composed prism 72. Then, the light is concentrated onto a reproduction-use light detector 76 by the reproduction hologram element 75.

Part of output light from the semiconductor laser 150 is splitted by the composed prism 72, and then input to a light detector 76. In this manner, the light is made incident on nowhere but the light receiving surface of the light detector 151, thus preventing the generation of an unnecessary diffusion delay signal.

A light detection output of the reproduction-use light detector 76 is guided to an operation processing circuit 81 made of a pre-amplifier and an operation circuit, in which a reproduction information signal and a servo signal are generated separately. The servo signal is guided to a servo circuit 83 so as to control the moving optical head 77. The reproduction information signal is guided to a digitization-PLL circuit 82 for generating a digital signal which can be digitally processed and a reproduction clock, where the signal is processed and then supplied to a disk controller 84. The disk controller 84 includes a modulation/demodulation circuit and an error correction circuit, as well as a controller for controlling the servo circuit 83 and the recording waveform generating circuit 80, an SCSI interface and the like. The disk controller 84 judges the abnormality detection state of the semiconductor laser control circuit 101, and achieves the stabilization of the information recording/reproducing apparatus.

The recording waveform generating circuit 80 includes a D/A converter for accurately setting a control current signal Ic, and receives data from the controller 84 via a data bus. The recording waveform generating circuit 80 receives temperature-dependency data of the optical disk 78 on which laser beam is irradiated. With the high-frequency superimposition, which is controlled to be turned on when data is reproduced, a very high noise reduction effect can be achieved when it is co-used with the wide band front APC operation. Thus, a stable recording and reproducing operation can be achieved at all times.

It should be noted that in the information recording/reproducing apparatus shown in FIG. 11, it is possible to use, in place of the semiconductor laser control circuit 101 shown in FIG. 9, a semiconductor laser control circuit (semiconductor device for driving a laser) such as shown in FIGS. 4, 7 or 10.

Figure 12:
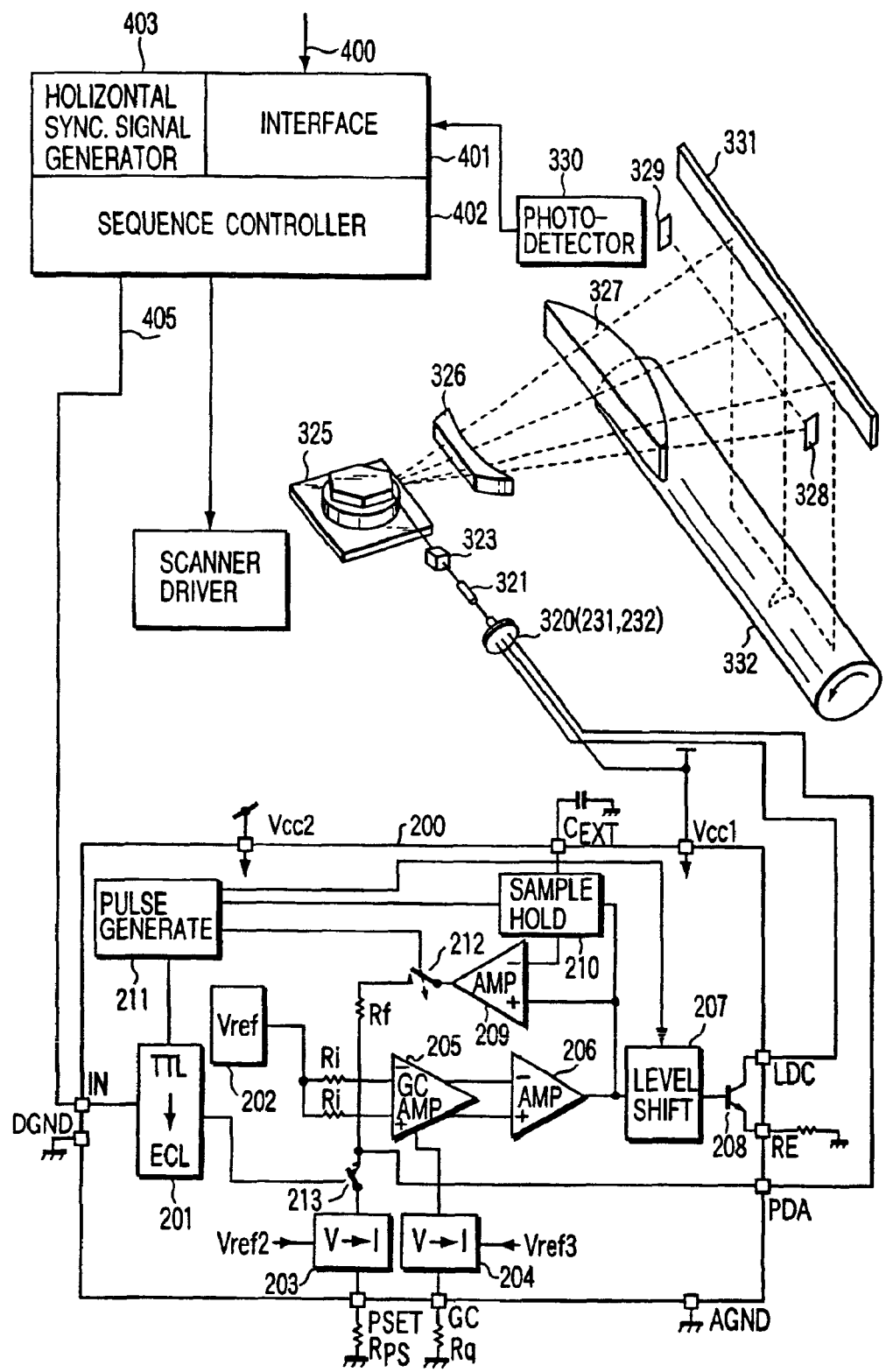
FIG. 12 is a diagram showing the structure of the image recording apparatus constituted by the semiconductor laser apparatus shown in FIG. 10.

FIG. 12 is a block diagram showing the structure of an image recording apparatus according to still another embodiment of the present invention, which employs the semiconductor laser apparatus according to the before-described embodiment.

An image signal (video signal) 400 emitted from an image controller (not shown) is guided to an input terminal IN of a semiconductor laser control circuit 200 from a sequence controller 403 via an interface 401. The semiconductor laser control circuit 200 turns the laser section 320 on or off in reply to a laser control signal formed from the image signal 400, at a high light amount setting accuracy and a high-speed responsibility. In the laser section 320, the semiconductor laser 231 and the light detecting amount 232 are provided. The laser output beam from the laser section 320 is irradiated onto a polygon mirror 325 via a collimator lens 323 and a cylindrical lens 321. The polygon mirror is rotated at a constant speed, and the laser beam reflected by the polygon mirror 325 travels from a toric lens 326 through an image formation lens 327, and then reflects on a mirror 331, thus scanning the photosensitive drum 332.

The photosensitive drum 332 is rotated at a constant speed such that scanning is not repeated on one place. An image on the photosensitive drum 332 is drawn with dots in such a manner that dots are formed on one on another partially, and therefore dots are connected to each other to form a line when seen, thus forming a continuous image.

Each time a laser beam scans one surface of the polygon mirror 325, the timing of the scanning is detected by the light detector 330 via the mirrors 328 and 329, and the timing for outputting a laser control signal is adjusted by a horizontal synchronization signal generating section 403.

The high-speed responsibility of the semiconductor laser control circuit 200 contributes to the significant improvement in the printing speed, and the high light amount setting accuracy makes it possible to completely prevent the ununiformity in printing.

It should be noted that in the image recording apparatus shown in FIG. 12, it is possible to use, in place of the semiconductor laser control circuit 200 shown in FIG. 10, a semiconductor laser control circuit (semiconductor device for driving a laser) such as shown in FIGS. 7 or 9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser apparatus comprising:
   a semiconductor laser;
   a light intensity detector configured to detect intensity of a laser beam output from the semiconductor laser;
   an amplifying circuit including a non-reversal input terminal and a reversal input terminal that are each configured to receive predetermined input signals the reversal input terminal being further configured to receive an output signal from the light intensity detector as a negative feedback signal;
   a high-frequency signal generating circuit configured to generate a high-frequency signal having a predetermined frequency;
   a high-frequency signal superimposing circuit configured to superimpose the high-frequency signal onto an output signal of the amplifying circuit;
   a laser drive circuit configured to supply a drive current to the semiconductor laser on the basis of an output signal from the amplifying circuit having the superimposed high frequency signal thereon; and
   a modulation signal current generating section configured to apply a modulation signal current to the reversal input terminal of the amplifying circuit so as to adjust an amount of laser beam light from the semiconductor laser.

2. A semiconductor laser apparatus according to claim 1, wherein the modulation signal current generating section includes a switch element and a current source connected in series between the reversal input terminal of the amplifying circuit and a ground node, the switch element being configured to be intermittently controlled by a modulation signal applied thereto to control switching of irradiation of the laser beam from the semiconductor laser to perform the adjustment of the amount of laser beam light.

3. A semiconductor laser apparatus according to claim 1, wherein the modulation signal current generating section includes a switch element and a current source connected in series between the reversal input terminal of the amplifying circuit and a ground node, the switch element comprising two transistors configured as a differential pair having differential input terminals configured to receive modulation signals configured to control differential pair switching to provide intermittent current from the current source to the reversal input terminal of the amplifying circuit to perform the adjustment of the amount of laser beam light.

4. A semiconductor laser apparatus according to claim 1, wherein the modulation signal current generating section includes a current-current conversion circuit configured to current-to-current convert a control input signal from outside and to output a current-to-current converted signal to the reversal input terminal of the amplifying circuit to perform the adjustment of the amount of the laser beam light.

5. A semiconductor laser apparatus according to claim 1, wherein the modulation signal current generating section includes:
   a first current-current conversion circuit configured to receive a control input signal from outside and to supply a first current-current converted output to the reversal input terminal of the amplifying circuit in response thereto; and
   a second current-current conversion circuit configured to receive the first current-current converted output from the first current-current conversion circuit and to supply a drive voltage responsive thereto to control the driving of the laser drive circuit to perform the adjustment of the amount of laser beam light.

6. A semiconductor laser apparatus according to claim 1, wherein the modulation signal current generating section includes:
   a switch element configured to receive and to be intermittently controlled by a modulation signal so as to provide on/off switching, and
   a voltage-current conversion circuit connected in series with the switch element between the reversal input terminal of the amplifying circuit and a ground node, wherein
   the switch element on/off switching provides an output current from the voltage-current conversion circuit to the reversal input terminal of the amplifying circuit to perform the adjustment of the amount of laser beam light.

7. A semiconductor laser apparatus according to claim 1, further comprising:
   a reference voltage generating circuit; and
   input resistors, each input resistor having substantially a same resistance value and being respectively connected between an output terminal of the reference voltage generating circuit and a respective one of the non-reversal input terminal and the reversal input terminal of the amplifying circuit.

8. A semiconductor laser apparatus according to claim 7, wherein the amplifying circuit includes:
   a gain controllable operation amplifying circuit having the non-reversal input terminal and the reversal input terminal, each terminal being further configured to receive a respective reference voltage from a respective one of the input resistors as at least part of each of the predetermined input signals; and
   a gain-fixed type control amplifying circuit configured to connect a next stage to the gain controllable operation amplifying circuit.

9. A semiconductor laser apparatus according to claim 1, further comprising:
   a level shift circuit configured to shift a level of a reference voltage input to provide a shifted output; and
   input resistors having substantially a same resistance value, each input resistor being connected between an output terminal of the level shift circuit and a respective one of the non-reversal input terminal and the reversal input terminal of the amplifying circuit so that the shifted output passed by each respective input resistor will provide at least part of each of the predetermined input signals.

10. A semiconductor laser apparatus according to claim 9, wherein the amplifying circuit includes:
    a gain controllable operation amplifying circuit having the non-reversal input terminal and the reversal input terminal; and
    a gain-fixed type control amplifying circuit configured to connect a next stage to the gain controllable operation amplifying circuit.

11. A semiconductor laser apparatus according to claim 1, further comprising:
    a level shift circuit connected between the amplifying circuit and the laser drive circuit.

12. An information recording/reproducing apparatus comprising:
    a semiconductor laser apparatus including,
    a semiconductor laser,
    a light intensity detector configured to detect intensity of a laser beam output from the semiconductor laser,
    an amplifying circuit including a non-reversal input terminal and a reversal input terminal that are each configured to receive predetermined input signals, the reversal input terminal being further configured to receive an output signal from the light intensity detector as a negative feedback signal,
    a high-frequency signal generating circuit configured to generate a high-frequency signal having a predetermined frequency,
    a high-frequency signal superimposing circuit configured to superimpose the high-frequency signal from the high-frequency generating circuit onto an output signal of the amplifying circuit,
    a laser drive circuit configured to supply a drive current to the semiconductor laser on the basis of the output signal from the amplifying circuit having the superimposed high frequency signal thereon, and
    a modulation signal current generating section configured to apply a modulation signal current to the reversal input terminal of the amplifying circuit so as to adjust an amount of laser beam light from the semiconductor laser;
    an optical system configured to irradiate the laser beam from the semiconductor laser apparatus onto a recording medium;
    a detection section configured to detect laser beam light reflected from the recording medium and to provide an output based thereon;
    a reproduction signal generating section configured to receive the output from the detection section and to generate a reproduction signal based thereon; and
    a control signal generating section configured to generate a control signal to be supplied to the semiconductor laser apparatus.

* * * * *